United States Patent [19]
Sasaki

[11] Patent Number: 5,856,682
[45] Date of Patent: *Jan. 5, 1999

[54] SEMICONDUCTOR LIGHT-EMITTING DEVICE AND METHOD FOR PRODUCING THE SAME

[75] Inventor: Kazuaki Sasaki, Osaka, Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 652,357

[22] Filed: May 23, 1996

[30] Foreign Application Priority Data

May 26, 1995 [JP] Japan ..................................... 7-128311

[51] Int. Cl.$^6$ .................................................. H01L 33/00
[52] U.S. Cl. .................................................. 257/96
[58] Field of Search ................................................ 257/96

[56] References Cited

U.S. PATENT DOCUMENTS

| | | |
|---|---|---|
| 5,048,035 | 9/1991 | Sugawra et al. . |
| 5,153,859 | 10/1992 | Sugawara et al. . |
| 5,299,216 | 3/1994 | van der Poel ............. 257/96 |
| 5,466,950 | 11/1995 | Sugawara et al. . |
| 5,537,433 | 7/1996 | Watanabe . |
| 5,578,839 | 11/1996 | Nakamura et al. . |
| 5,610,413 | 3/1997 | Fan et al. . |
| 5,639,674 | 6/1997 | Nozaki et al. . |

FOREIGN PATENT DOCUMENTS

| | | |
|---|---|---|
| 5-110135 | 4/1993 | Japan . |
| 5-335619 | 12/1993 | Japan . |

*Primary Examiner*—Stephen Meier
*Attorney, Agent, or Firm*—Nixon & Vanderhye P.C.

[57] ABSTRACT

A semiconductor light-emitting device includes: a semiconductor substrate of a first conductive type, and a multilayered structure formed on the semiconductor substrate. The multilayered structure includes a first cladding layer of the first conductive type, an undoped active layer, a second cladding layer of a second conductive type, and a current diffusing layer of the second conductive type which are subsequently deposited. An undoped spacer layer is provided between the undoped active layer and the second cladding layer.

17 Claims, 10 Drawing Sheets

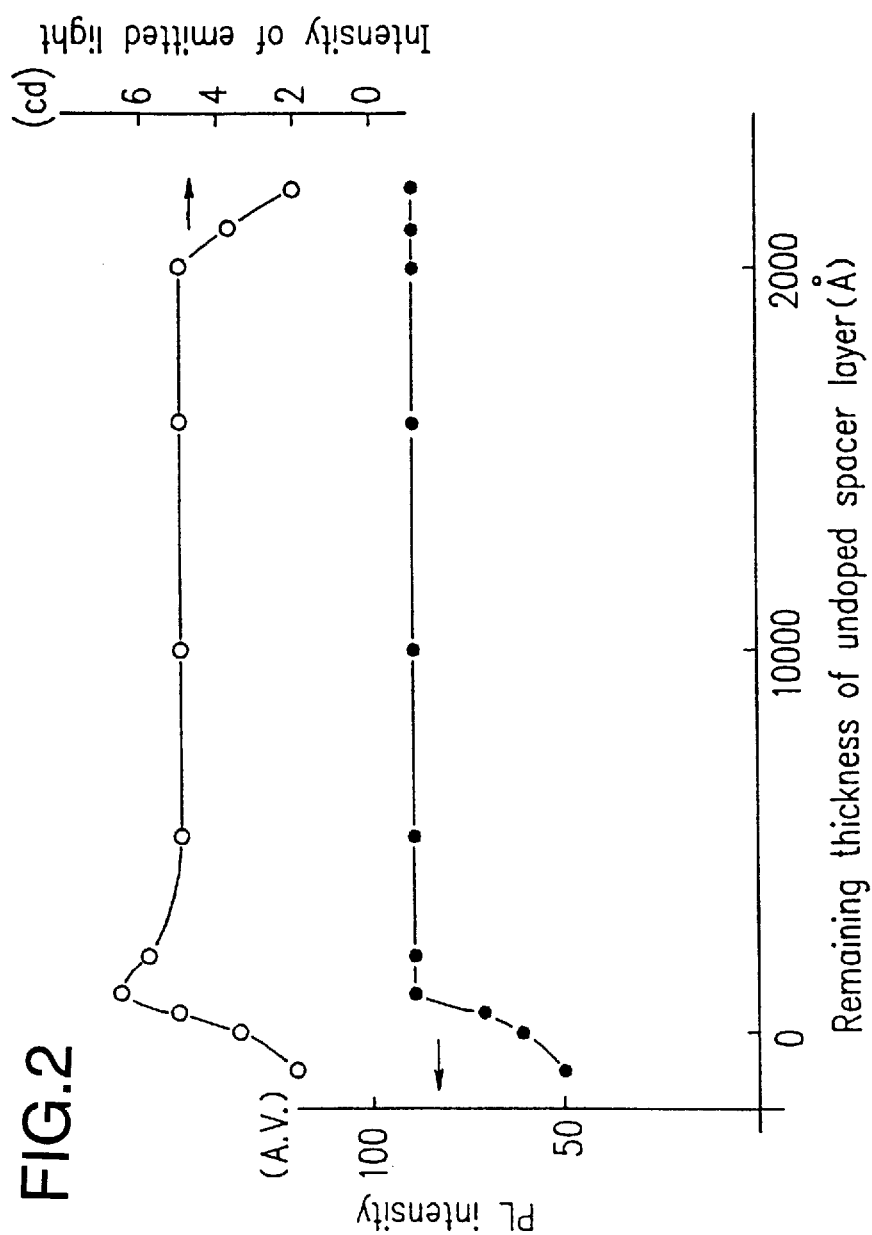

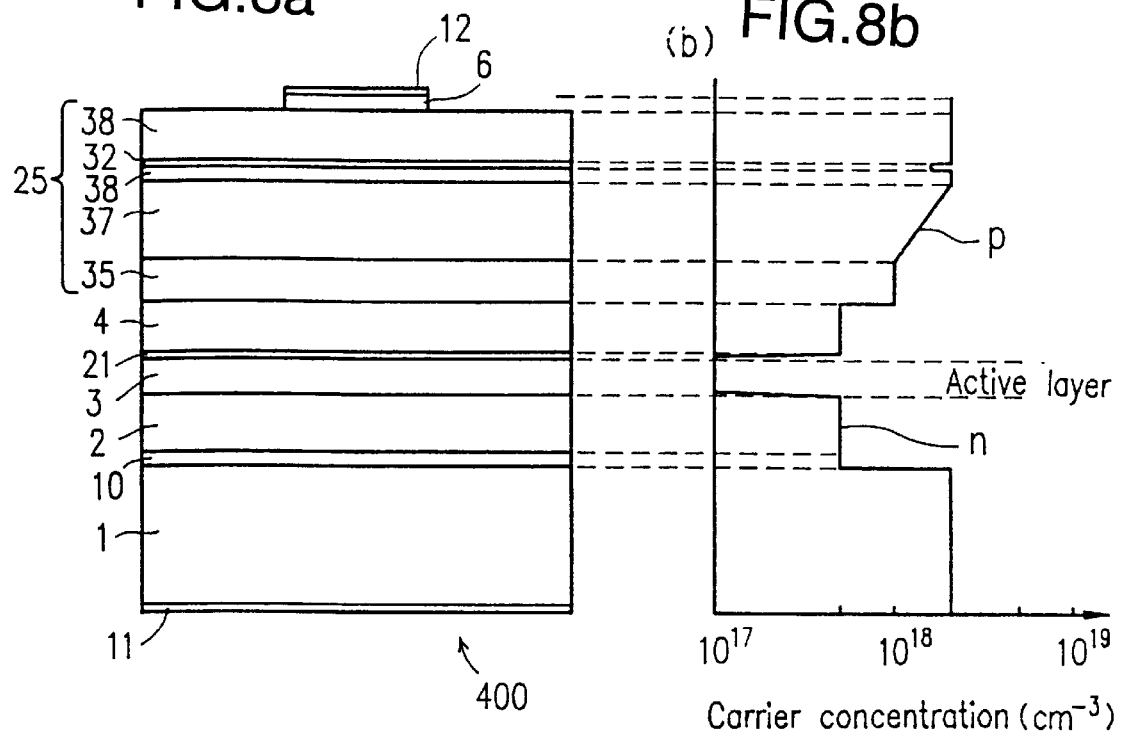
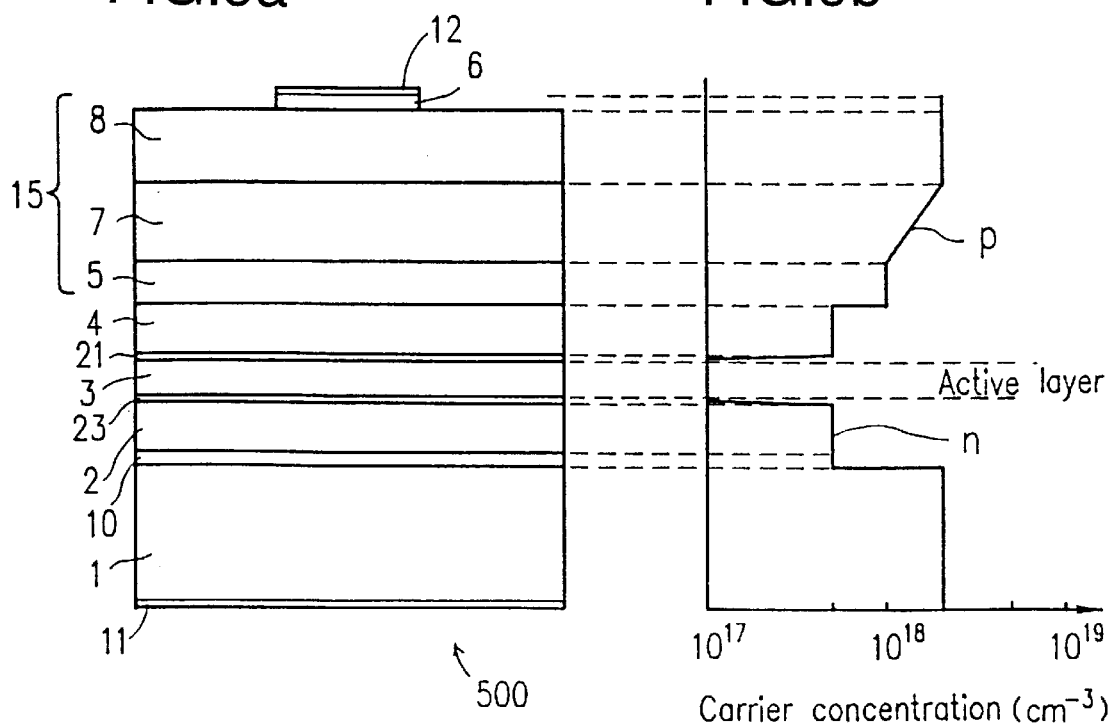

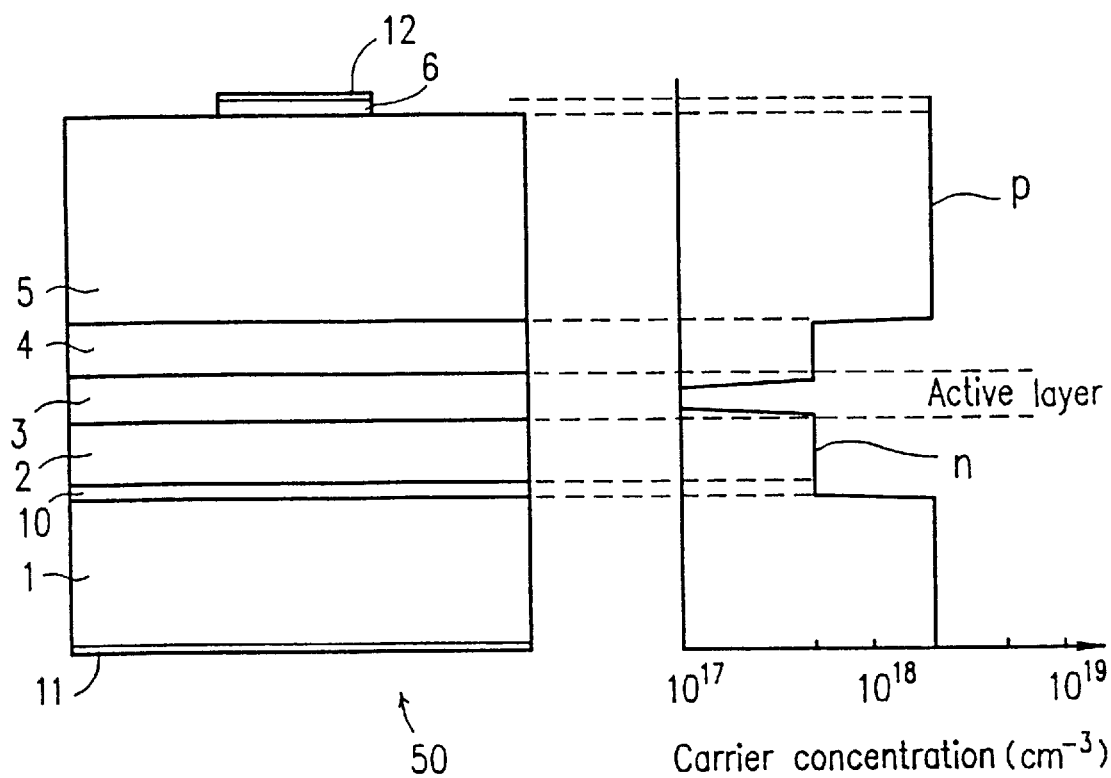
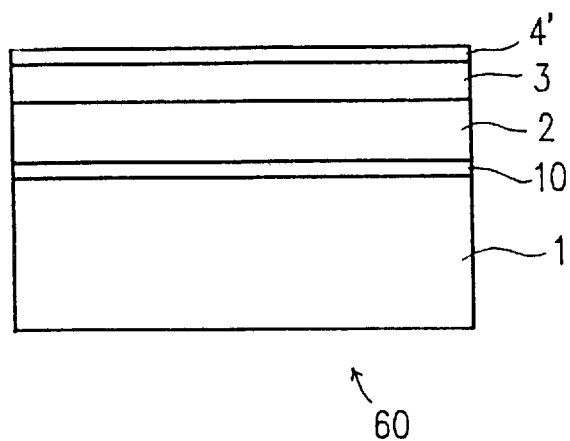
Fig.11

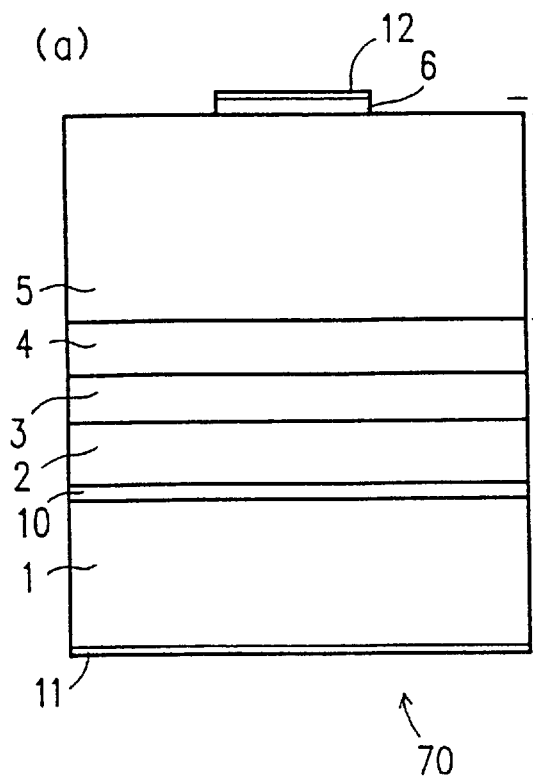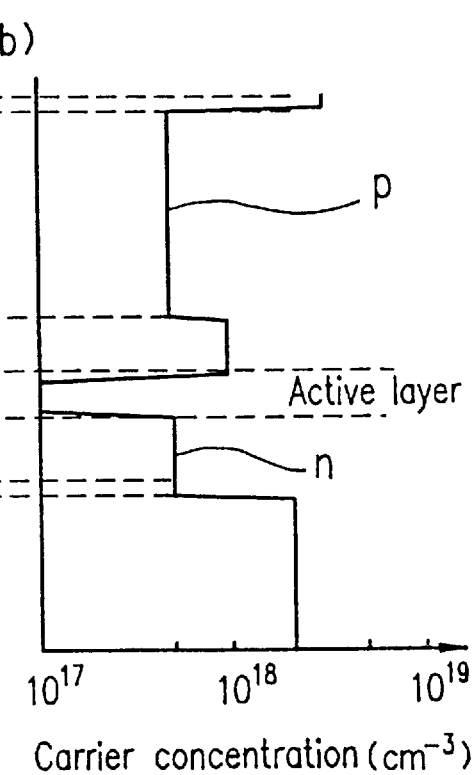
FIG.12a
FIG.12b

SEMICONDUCTOR LIGHT-EMITTING DEVICE AND METHOD FOR PRODUCING THE SAME

BACKGROUND OF THE INVENTION

1. Field of the Invention:

The present invention relates to a semiconductor light-emitting device such as an light-emitting diode having a current diffusing layer; and a method for producing the same.

2. Description of the Related Art:

In recent years, light-emitting diodes (hereinafter, referred to as "LEDs") have been in the limelight as display devices intended for use indoors and outdoors. Particularly, it is supposed that an outdoor display market will abruptly expand in the years ahead with increase in luminance of LEDs, and LEDs are expected to grow into display media so as to take the place of neon signs in future.

High-intensity LEDs have been realized for a few years in GaAlAs-type LEDs having a double hetero (DH) structure for emitting light in a red-color frequency band for a few years. Moreover, recently, some prototypes of AlGaInP-type LEDs having a DH structure capable of emitting light in the orange-color to green-color frequency bands have been proposed so as to realize high-intensity LEDs.

A portion (a) of FIG. 10 is a cross-sectional view showing a device structure of a conventional AlGaInP-type LED 50 capable of emitting light in the yellow-color frequency band. A portion (b) of FIG. 10 is a diagram showing a carrier concentration profile of each layer of the LED 50. The carrier concentration profile is data obtained from the measurement using a secondary ion mass spectrometer (SIMS), and the absolute value thereof is calibrated by the measurement data for a standard sample.

The LED 50 shown in the portion (a) of FIG. 10 has a multilayered structure formed by sequentially growing, on an n-type GaAs substrate 1 by an MOCVD method, an n-type GaAs buffer layer 10 (thickness: about 0.1 $\mu$m, Si doping amount: about $5 \times 10^{17}$ cm$^{-3}$), an n-type $(Al_{0.7}Ga_{0.3})_{0.5}In_{0.5}P$ cladding layer 2 (thickness: about 1.0 $\mu$m, Si doping amount: about $5 \times 10^{17}$ cm$^{-3}$), an undoped $(Al_{0.3}Ga_{0.7})_{0.5}In_{0.5}P$ active layer 3 (thickness: about 0.6 $\mu$m), a p-type $(Al_{0.7}Ga_{0.3})_{0.5}In_{0.5}P$ cladding layer 4 (thickness: about 1.0 $\mu$m, Zn doping amount: about $1 \times 10^{18}$ cm$^{-3}$), a p-type $Al_{0.7}Ga_{0.3}As$ current diffusing layer 5 (thickness: about 6 $\mu$m, Zn doping amount: about $3 \times 10^{18}$ cm$^{-3}$), and a p-type GaAs cap layer 6 (thickness: about 1 $\mu$m, Zn doping amount: about $3 \times 10^{18}$ cm$^{-3}$). On the underside of the n-type GaAs substrate 1, that is, on the surface opposite to the multilayered structure, an electrode 11 is formed. On the surface of the p-type GaAs cap layer 6, an electrode 12 is formed. In this manner, the LED 50 is constituted.

In the LED 50, a pn junction is formed inside of the active layer 3, and electrons recombine with holes therein so that light is emitted. Intensity of the emitted light is typically about 1.5 candelas when the operating current of about 20 mA is applied.

In the above-mentioned conventional LED 50, the active layer 3 is designed to be an undoped layer. However, in reality, as shown by the carrier concentration profile obtained by a SIMS measurement in the portion (b) of FIG. 10, a p-type dopant (Zn) of the p-cladding layer 4 diffuses into the active layer 3. The diffusion of the p-type dopant degrades crystallinity of the active layer 3, which causes formation of non-radiative centers. As a result, efficiency of light emission of the LED 50 is degraded.

SUMMARY OF THE INVENTION

The semiconductor light-emitting device of this invention includes: a semiconductor substrate of a first conductive type; and a multilayered structure formed on the semiconductor substrate. The multilayered structure includes at least a first cladding layer of the first conductive type, an undoped active layer, a second cladding layer of a second conductive type, and a current diffusing layer of the second conductive type, which are subsequently deposited. An undoped spacer layer is further provided between the undoped active layer and the second cladding layer.

In one embodiment, carrier concentration of a second portion of the current diffusing layer positioned remotely from the second cladding layer is higher than the carrier concentration of a first portion of the current diffusing layer positioned closely to the second cladding layer. In another embodiment, the carrier concentration continuously changes in a portion positioned between the first portion and the second portion of the current diffusing layer. Preferably, the carrier concentration of the first portion of the current diffusing layer is in a range between about $0.5 \times 10^{18}$ cm$^{-3}$ and about $1.5 \times 10^{18}$ cm$^{-3}$. In addition, the carrier concentration of the second portion of the current diffusing layer is preferably about $2 \times 10^{18}$ cm$^{-3}$ or more.

Preferably, a thickness of the undoped spacer layer is in a range between about 50 Å and about 2000 Å.

In still another embodiment, the semiconductor light-emitting device further includes a second undoped spacer layer containing no dopant positioned between the first cladding layer and the undoped active layer.

In one embodiment, the first cladding layer, the undoped active layer, and the second cladding layer are formed using AlGaInP or GaInP as main material; the current diffusing layer is formed using a material selected from a group consisting of AlGaAs, AlGaInP, GaP, and AlGaP as main material; and a dopant of the second cladding layer is Zn, Mg, or Be.

According to another aspect of the invention, a method for producing a semiconductor light-emitting device is provided. The method includes the steps of: forming a multilayered structure on a semiconductor substrate of a first conductive type, the multilayered structure including at least a first cladding layer of the first conductive type, an undoped active layer, a second cladding layer of a second conductive type, and a current diffusing layer of the second conductive type; and forming an undoped spacer layer between the undoped active layer and the second cladding layer.

In one embodiment, the current diffusing layer is formed so that carrier concentration of a second portion of the current diffusing layer positioned remotely from the second cladding layer is higher than the carrier concentration of a first portion of the current diffusing layer positioned closely to the second cladding layer. In another embodiment, the current diffusing layer is formed so that the carrier concentration continuously changes in a portion positioned between the first and second portions of the current diffusing layer. Preferably, the carrier concentration of the first portion of the current diffusing layer is in a range between about $0.5 \times 10^{18}$ cm$^{-3}$ and about $1.5 \times 10^{18}$ cm$^{-3}$. In addition, the carrier concentration of the second portion of the current diffusing layer is preferably about $2 \times 10^{18}$ cm$^{-3}$ or more.

Preferably, the thickness of the undoped spacer layer is in a range between about 50 Å and about 2000 Å.

In still another embodiment, the method further includes the step of forming a second undoped spacer layer between the first cladding layer and the undoped active layer.

In one embodiment, the first cladding layer, the undoped active layer, and the second cladding layer are formed using AlGaInP or GaInP as main material; the current diffusing layer is formed using a material selected from a group consisting of AlGaAs, AlGaInP, GaP, and AlGaP as main material; and a dopant of the second cladding layer is Zn, Mg, or Be.

In the aforementioned semiconductor light-emitting device of the present invention, the undoped spacer layer is provided at least between the undoped active layer and the second cladding layer. Thus, diffusion of the dopant contained in the second cladding layer, which is induced by the current diffusing layer, is blocked at the undoped spacer layer. In this manner, degradation of crystallinity of the active layer and resultant formation of the non-radiative centers are suppressed, making it possible to efficiently output light to the outside.

Moreover, the carrier concentration in the portion of the current diffusing layer far from the second cladding layer is set to be higher than that in the portion thereof closer to the second cladding layer, so that the diffusion of the dopant into the active layer is reduced.

Furthermore, such diffusion of the dopant is remarkable when the first cladding layer, the undoped active layer, and the second cladding layer are formed using AlGaInP or GaInP as the main material, and the current diffusing layer is formed using AlGaAs, AlGaInP, GaP, or AlGaP as the main material, and moreover, the dopant contained in the second cladding layer is Zn, Mg, or Be. According to the present invention, the advantage of suppressing the diffusion of the dopant can be assuredly obtained even in such cases.

Thus, the invention described herein makes possible the advantages of (1) providing a semiconductor light-emitting device having an internal structure of crystals exhibiting an excellent light emitting efficiency; and (2) providing a method for producing the same.

These and other advantages of the present invention will become apparent to those skilled in the art upon reading and understanding the following detailed description with reference to the accompanying figures.

BRIEF DESCRIPTION OF THE DRAWINGS

A portion (a) of FIG. 1 is a cross-sectional view showing a device structure of an LED according to a first example of the present invention. A portion (b) of FIG. 1 is a diagram illustrating a carrier concentration profile of each layer included in the LED.

FIG. 2 is a diagram illustrating the relationship among the remaining thickness of an undoped spacer layer, the PL intensity, and the intensity of emitted light of the LED shown in the portion (a) of FIG. 1.

Figures 4A, 4B:
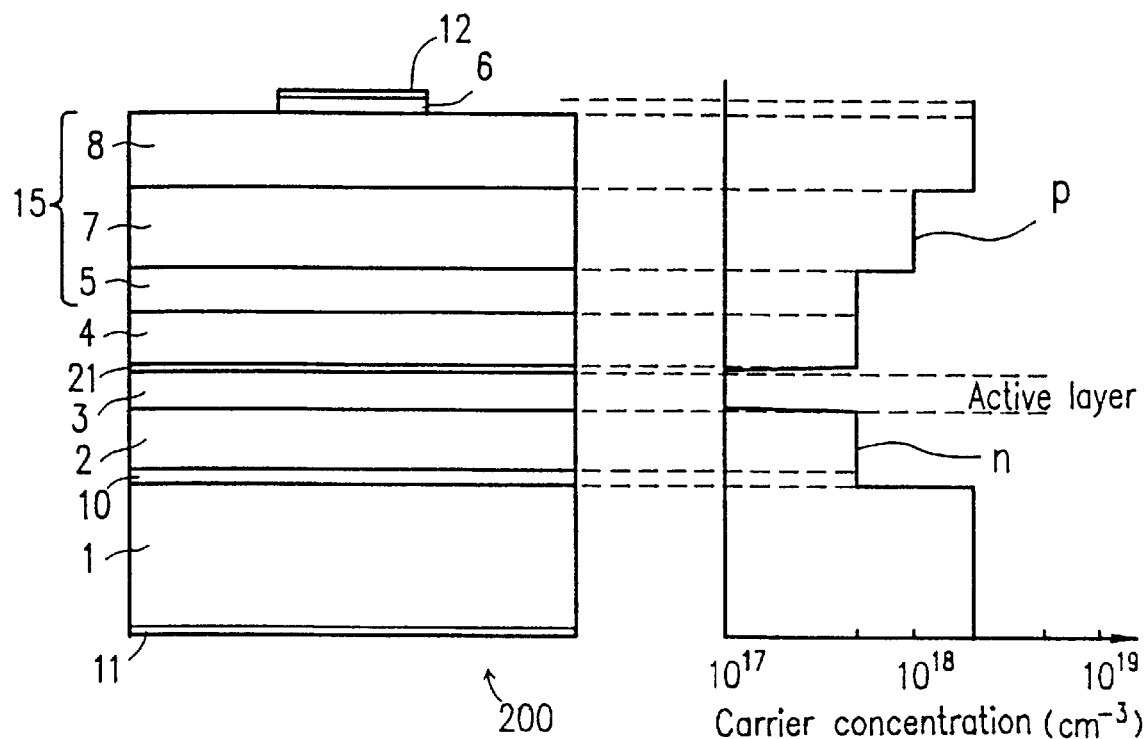

A portion (a) of FIG. 4 is a cross-sectional view showing a device structure of the LED according to a second example of the present invention. A portion (b) of FIG. 4 is a diagram showing a carrier concentration profile of each layer included in the LED.

Figure 5:
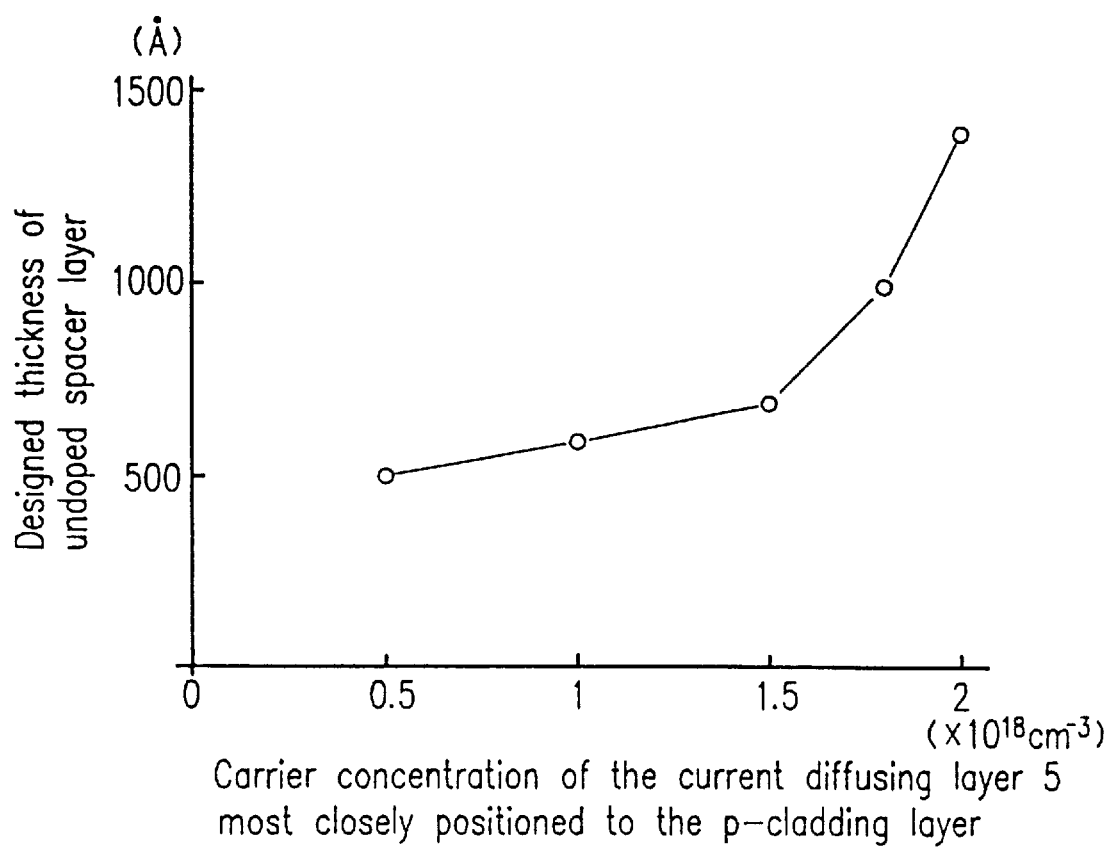

FIG. 5 is a diagram illustrating the relationship between the carrier concentration of the current diffusing layer most closely positioned to the p-cladding layer, and the designed thickness of the undoped spacer layer of the LED shown in the portion (a) of FIG. 4.

Figures 6A, 6B:
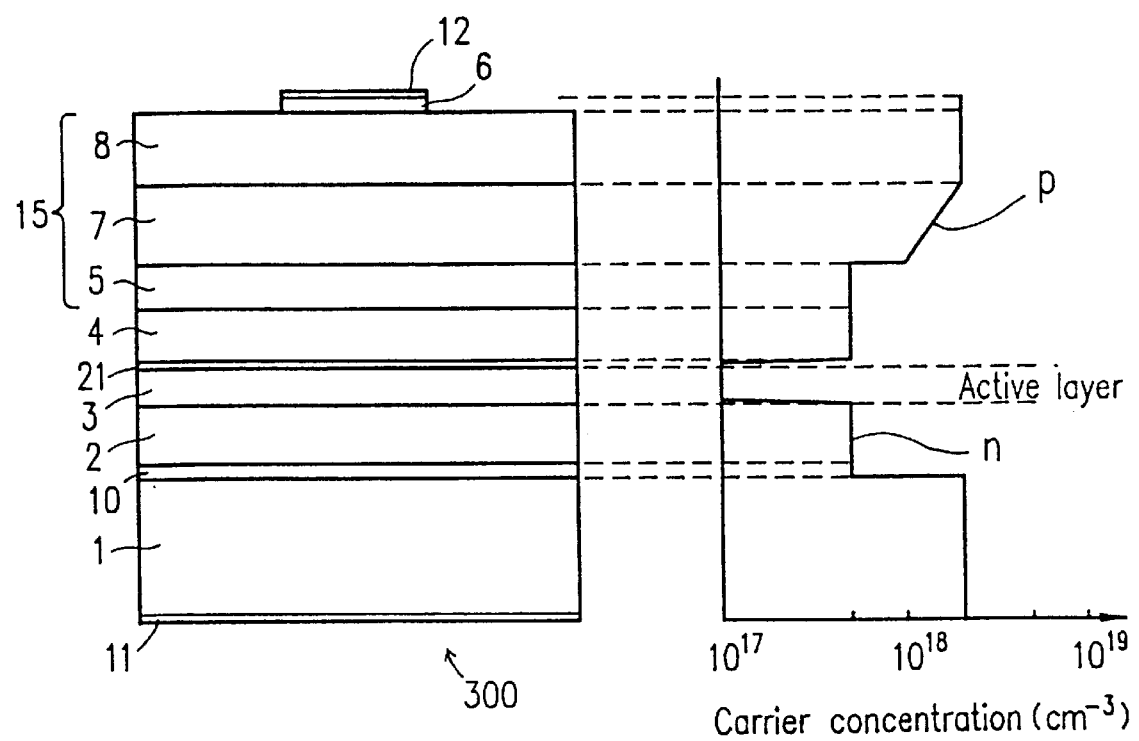

A portion (a) of FIG. 6 is a cross-sectional view showing a device structure of the LED according to a third example of the present invention. A portion (b) of FIG. 6 is a diagram showing a carrier concentration profile of each layer included in the LED.

Figure 7:
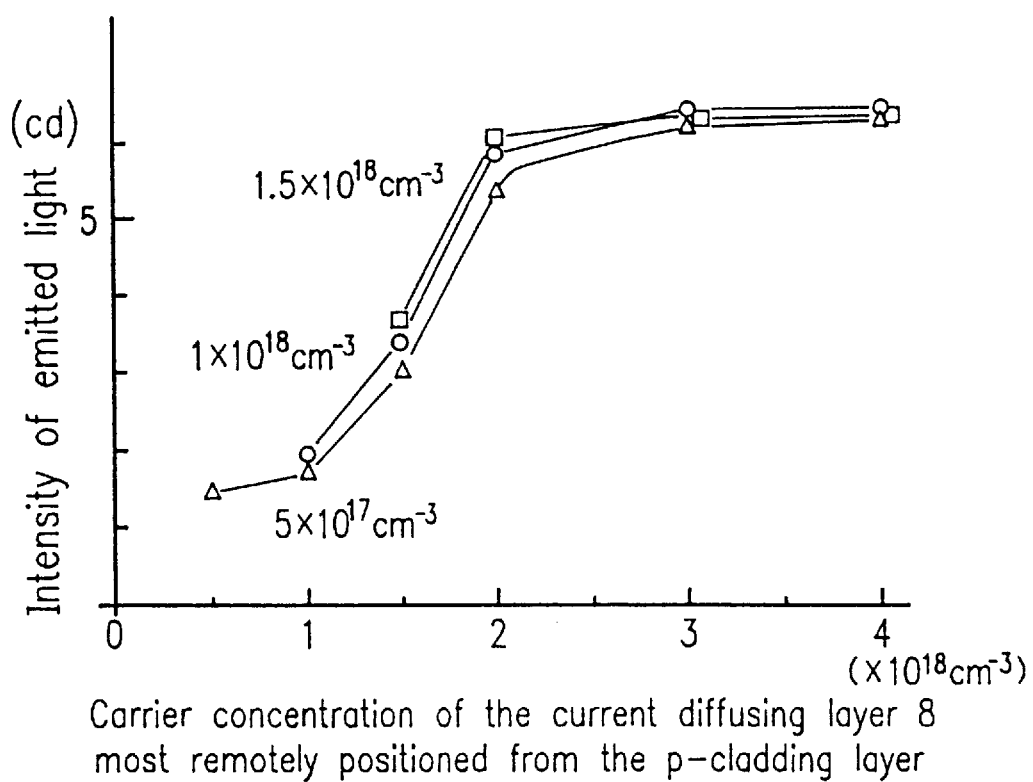

FIG. 7 is a diagram illustrating the relationship between the carrier concentration of the current diffusing layer most remotely positioned from the p-cladding layer, and the intensity of emitted light of the LED shown in the portion (a) of FIG. 6, when the carrier concentration of the current diffusing layer most closely positioned to the p-cladding layer is used as a parameter.

A portion (a) of FIG. 8 is a cross-sectional view showing a device structure of the LED according to a fourth example of the present invention. A portion (b) of FIG. 8 is a diagram showing a carrier concentration profile of each layer contained in the LED.

A portion (a) of FIG. 9 is a cross-sectional view showing a device structure of the LED according to a fifth example of the present invention. A portion (b) of FIG. 9 is a diagram showing a carrier concentration profile of each layer included in the LED.

A portion (a) of FIG. 10 is a cross-sectional view showing a device structure of the conventional LED. A portion (b) of FIG. 10 is a diagram showing a carrier concentration profile of each layer included in the LED.

FIG. 11 is a cross-sectional view showing a structure of an evaluation sample used in a first experiment conducted by the present inventors.

A portion (a) of FIG. 12 is a cross-sectional view showing a structure of an LED used for evaluation in a second experiment conducted by the present inventors. A portion (b) of FIG. 12 is a diagram illustrating a carrier concentration profile of each layer included in the LED used for evaluation.

DESCRIPTION OF THE PREFERRED EMBODIMENTS

Hereinafter, prior to the description of examples of the present invention, the results of the experiments conducted by the present inventors in the process of making the present invention will be described in relation to the degradation phenomenon of the crystallinity of the active layer in the aforementioned conventional LED.

First, the results of the first experiment will be described.

In the first experiment, the cap layer 6 and the current diffusing layer 5 are entirely removed from the LED 50 shown in the portion (a) in FIG. 10 by etching. Then, a part of a p-cladding layer 4 is removed by etching so that the remaining portion thereof has a thickness of about 0.25 $\mu$m. In this manner, a sample 60 used for evaluation with a structure shown in FIG. 11 is formed. Hereinafter, the sample used for evaluating the characteristics such as shown in FIG. 11 is referred to as "a partial sample". The top layer of the partial sample 60 is a thinned cladding layer 4'.

The partial sample 60 is irradiated with an Ar laser (a wavelength $\lambda$=488 nm) from a surface of the cladding layer 4', and then, the photoluminescence (PL) intensity is measured. The obtained measurement data is typically 16 at a relative value. When the p-type dopant (in the above example, Zn) diffuses into the active layer 3, non-radiative centers are formed. As a result, the value of the PL intensity is lowered.

On the other hand, as a comparison sample, another sample for evaluation is formed by growing each layer as undoped layers so as to have a multilayered structure similar to that of the LED 50 shown in a portion (a) of FIG. 10. Hereinafter, the thus-obtained sample used for evaluating the characteristics is referred to as "an undoped sample". When the PL intensity of the undoped sample is measured under the conditions same as those for the aforementioned partial sample 60, the measurement data is typically 90 at a relative value.

The reason why the measurement value of the PL intensity of the partial sample 60 is lower as compared with the undoped sample is as follows: as described above, due to the degradation of the active layer 3 accompanied by the diffusion of the p-type dopant (in the above example, Zn) into the active layer 3, non-radiative centers are formed in the inside of the active layer 3.

In the LED structure, the p-type dopant is doped into both the p-cladding layer 4 and the p-type current diffusing layer 5. In order to find out which of these layers is mainly responsible for the diffusion of the p-type dopant, the present inventors conducted a second experiment. Hereinafter, the results thereof will be described.

A portion (a) of FIG. 12 is a cross-sectional view showing a device structure of a sample 70 used for evaluation (hereinafter also referred to as the "evaluation sample 70") in the second experiment. A portion (b) of FIG. 12 is a diagram showing a carrier concentration profile of each layer in the evaluation sample 70 obtained from the SIMS measurement. The absolute value of the concentration profile shown in the portion (b) of FIG. 12 is calibrated by the measurement data for the standard sample.

The evaluation sample 70 has a multilayered structure similar to that of the conventional LED 50 which has already described referring to the portion (a) of FIG. 10. The layers identical to those of the LED 50 are denoted by the same reference numerals, and the detailed description thereof will be omitted. The evaluation sample 70 and the LED 50 are different from each other in that the evaluation sample 70 includes the current diffusing layer 5 in which the carrier concentration is lowered to about $5 \times 10^{17}$ cm$^{-3}$. Since the carrier concentration of the p-cladding layer 4 is about $1 \times 10^{18}$ cm$^{-3}$ as is the case of the LED 50, the evaluation sample 70 includes the current diffusing layer 5 having the carrier concentration set to be lower than that of the p-cladding layer 4.

The evaluation sample 70 was subjected to the same measurement as that conducted in the first experiment. The measurement data of the PL intensity is typically 50 at a relative value. This value is marked in the middle point between the measurement value of the PL intensity of the aforementioned partial sample 60 and the measurement value of the PL intensity of the undoped sample. Moreover, as shown by the carrier concentration profile shown in (b) of FIG. 12 which is obtained from the SIMS measurement, in the evaluation sample 70, the diffusion of the p-type dopant (Zn) into the active layer 3 is very small.

As the result of the first and second experiments described above, the diffusion of the p-type dopant (for example, Zn) into the active layer 3 is induced, not by the p-cladding layer 4, but by the current diffusing layer 5 formed on the p-cladding layer 4. That is, it is supposed that if the p-type dopant concentration (the carrier concentration of Zn) of the current diffusing layer 5 is large, the diffusion of the p-type dopant (Zn) contained in the p-cladding layer 4 into the active layer 3 is promoted.

In the evaluation sample 70 shown in the portion (a) of FIG. 12, the intensity of emitted light is typically about 1.5 candelas when the operating current of about 20 mA is applied. This value is the same as the value obtained from the measurement of the LED 50 shown in the portion (a) of FIG. 10 which is conducted under the same conditions. The reason why these values are the same is considered as follows: In the evaluation sample 70 shown in FIG. 12, wherein the crystallinity of the active layer 3 is improved, the carrier concentration of the current diffusing layer 5 is low and the current is not sufficiently diffused therein. Accordingly, there is not enough increase in the intensity of emitted light for a surface emitting type light-emitting diode.

Hereinafter, the present invention will be described by way of examples referring to the accompanied drawings, based on the results of experiments and consideration regarding the disadvantages involved in the conventional art.

EXAMPLE 1

Figures 1A, 1B:
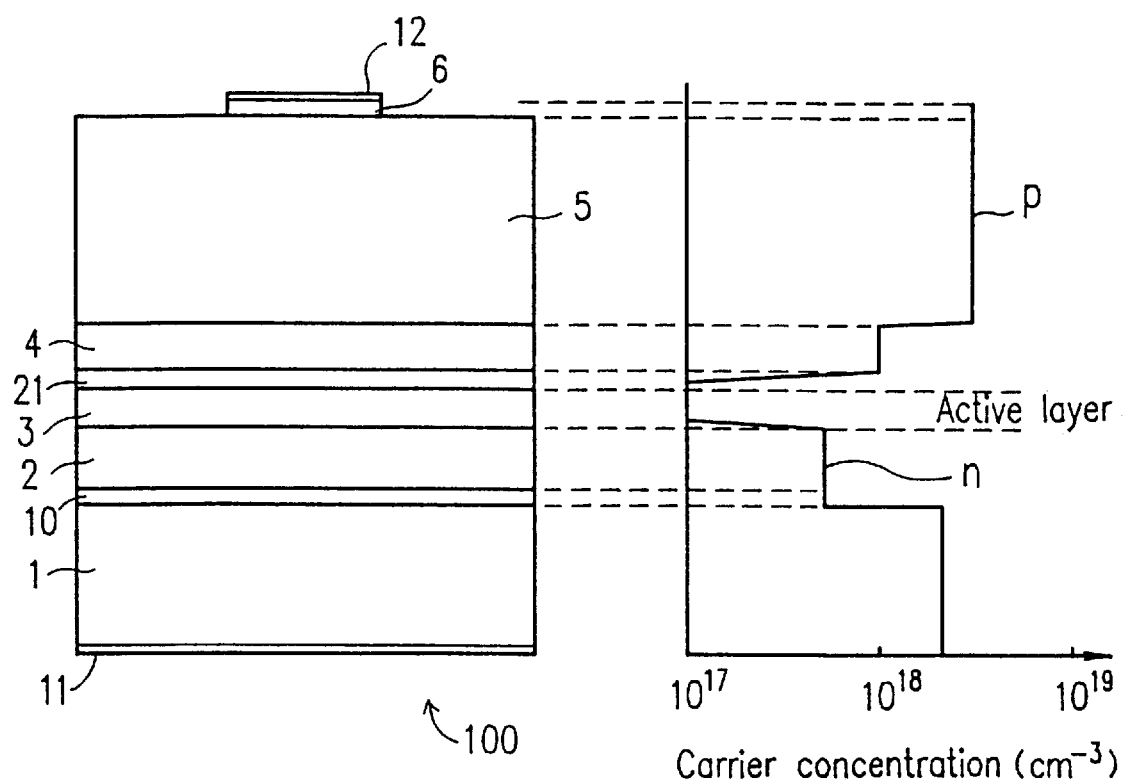

A portion (a) of FIG. 1 is a cross-sectional view showing a device structure of an AlGaInP type LED 100 according to a first example of the present invention. A portion (b) of FIG. 1 is a diagram showing a carrier concentration profile of each layer included in the LED 100. The carrier concentration profile is data obtained from the measurement conducted by using a SIMS, and an absolute value thereof is calibrated by the measurement data for the standard sample.

The LED 100 shown in the portion (a) of FIG. 1 has a multilayered structure obtained by sequentially forming, on an n-type GaAs substrate 1 by an MOCVD method, an n-type GaAs buffer layer 10 (thickness: about 0.1 μm, Si doping amount: about $5 \times 10^{17}$ cm$^{-3}$), an n-type $(Al_{0.7}Ga_{0.3})_{0.5}In_{0.5}P$ cladding layer 2 (thickness: about 1.0 μm, Si doping amount: about $5 \times 10^{17}$ cm$^{-3}$), an undoped $(Al_{0.3}Ga_{0.7})_{0.5}In_{0.5}P$ active layer 3 (thickness: about 0.6 μm), a p-type $(Al_{0.7}Ga_{0.3})_{0.5}In_{0.5}P$ cladding layer 4 (thickness: about 1.0 μm, Zn doping amount: about $1 \times 10^{18}$ cm$^{-3}$), a p-type $Al_{0.7}Ga_{0.3}As$ current diffusing layer 5 (thickness: about 6 μm, Zn doping amount: about $3 \times 10^{18}$ cm$^{-3}$), and a p-type GaAs cap layer 6 (thickness: about 1 μm, Zn doping amount: about $3 \times 10^{18}$ cm$^{-3}$). In addition, on the underside of the n-type GaAs substrate 1, that is, on the surface opposite to the multilayered structure, an electrode 11 is formed. On the surface of the p-type GaAs cap layer 6, an electrode 12 is formed.

Furthermore, In the LED 100, an undoped $(Al_{0.7}Ga_{0.3})_{0.5}In_{0.5}P$ spacer layer 21 having a thickness of about 1500 Å is formed between the active layer 3 and the p-cladding layer 4 formed on the active layer 3. The undoped spacer layer 21 is formed by not supplying a dopant source such as SiH$_4$ (monosilane), DEZn (diethylzinc), and the like during the growth.

In the LED 100 with the aforementioned structure according to the present example, as seen in the carrier concentration profile shown in the portion (b) of FIG. 1, the p-type dopant Zn contained in the p-cladding layer 4 diffuses into a part of the undoped spacer layer 21 until about 500 Å of the spacer layer 21 remains without containing the diffused Zn. Thus, Zn does not diffuse through the entire undoped spacer layer 21.

When the LED 100 is processed into a partial sample previously described referring to FIG. 11, the PL intensity is typically 80 at a relative value. This value corresponds to about 90% of the measurement value obtained with the undoped sample in the previously-described first experiment. The reason why the PL intensity is slightly lowered is considered as follows: about 500 Å in thickness of the undoped space layer 21 remains without diffusion of Zn, causing a decrease in efficiency of injecting holes into the active layer 3 which contributes to light-emitting recombination.

Moreover, when the LED 100 is molded in a package having a diameter of about 5 mm and the intensity of emitted light is measured, about 5 candelas of light intensity is exhibited when the operation currency of about 20 mA is applied.

FIG. 2 is a diagram illustrating the relationship between the remaining thickness of the undoped spacer layer 21 and the PL intensity (denoted by black circles) of the partial sample formed from the LED 100 shown in the portion (a) of FIG. 1. Also illustrated in the figure is the relationship between the remaining thickness of the undoped spacer layer 21 and the light intensity of emitted light (denoted by white circles) in the LED 100 in a complete form shown in the portion (a) of FIG. 1. Herein, "the remaining thickness of the undoped spacer 21" is defined as a difference obtained by deducting "the thickness of the region in which Zn diffuses" from "the design value of the thickness of the undoped spacer layer 21".

As shown in FIG. 2, when the remaining thickness of the undoped spacer layer 21 is about 100 Å or more, the PL intensity is of a constant magnitude. On the other hand, when the remaining thickness of the undoped spacer layer 21 is about 2000 Å or more, the intensity of emitted light expressed by the unit of candela is reduced. Moreover, when the remaining thickness of the undoped spacer 21 is about 100 Å, the intensity of emitted light reaches its peak. When the remaining thickness of the undoped spacer 21 is 0 Å or less (that is, Zn diffuses into the entire active layer 3), the intensity of emitted light is sharply reduced.

Figure 3:
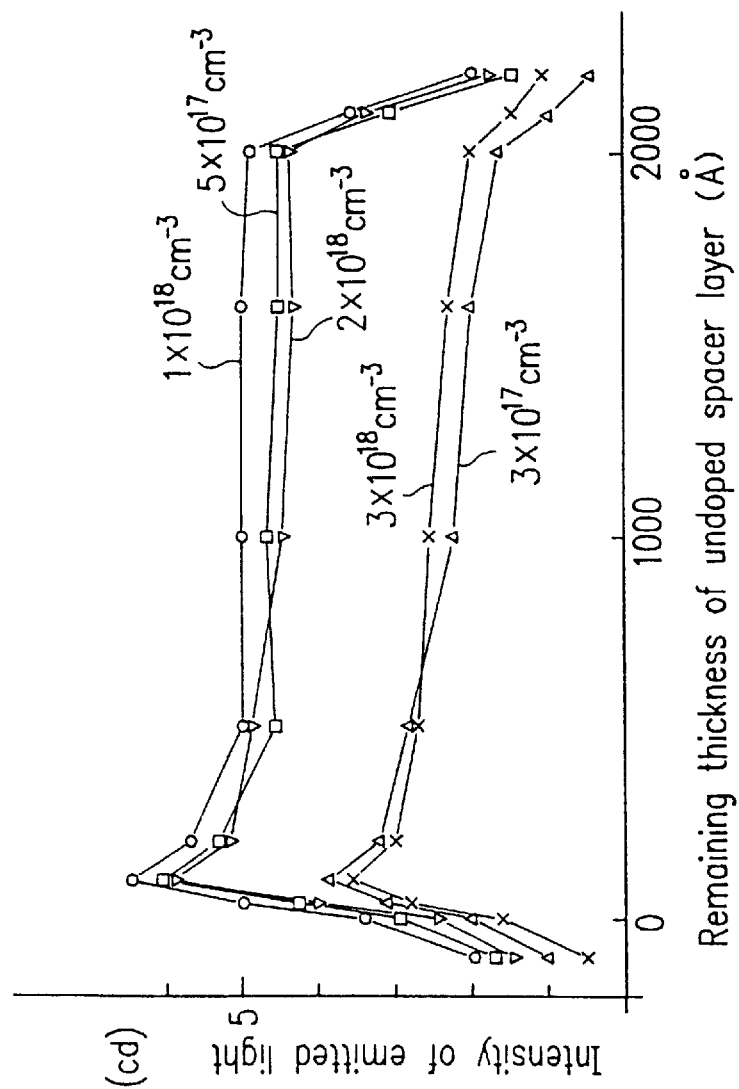
FIG. 3 is a diagram illustrating the relationship between the remaining thickness of the undoped spacer layer and the intensity of emitted light of the LED shown in the portion (a) of FIG. 1 when the carrier concentration of the p-cladding layer is used as a parameter.

FIG. 3 is a diagram illustrating the relationship between the remaining thickness of the undoped spacer layer 21 and the intensity of emitted light, when the carrier concentration of the P-type $(Al_{0.7}Ga_{0.3})_{0.5}In_{0.5}P$ cladding layer 4 is changed from about $3\times10^{17}$ cm$^{-3}$ to about $3\times10^{18}$ cm$^{-3}$ in the LED 100.

As in the case where the p-cladding layer 4 has the carrier concentration of about $1\times10^{13}$ cm$^{-3}$ shown in FIG. 2, the intensity of the emitted light shown by the unit of candela is sharply reduced for all the carrier concentration of the p-cladding layer 4 shown in FIG. 3 when the remaining thickness of the undoped spacer layer 21 is about 2000 Å or more and is about 0 Å or less (that is, when Zn diffuses into the active layer 3). Moreover, the intensity of the emitted light reaches its peak when the remaining thickness of the undoped spacer layer 21 is about 100 Å.

On the other hand, when the carrier concentration of the p-cladding layer 4 is in a range between about $5\times10^{17}$ cm$^{-3}$ and about $2\times10^{18}$ cm$^{-3}$, the intensity of the emitted light is high as a whole. Accordingly, it is desirable to set the carrier concentration of the p-cladding layer 4 to a range between about $5\times10^{17}$ cm$^{-3}$ and about $2\times10^{18}$ cm$^{-3}$.

EXAMPLE 2

A portion (a) of FIG. 4 is a cross-sectional view showing a device structure of an AlGaInP type LED 200 according to a second example of the present invention. A portion (b) of FIG. 4 is a diagram showing a carrier concentration profile of each layer included in the LED 200. The carrier concentration profile is data obtained from the measurement conducted by using a SIMS, and an absolute value thereof is calibrated by the measurement data for the standard sample.

The LED 200 shown in the portion (a) of FIG. 4 has a multilayered structure obtained by sequentially forming, on an n-type GaAs substrate 1 by an MOCVD method, an n-type GaAs buffer layer 10 (thickness: about 0.1 μm, Si doping amount: about $5\times10^{17}$ cm$^{-3}$), an n-type $(Al_{0.7}Ga_{0.3})_{0.5}In_{0.5}P$ cladding layer 2 (thickness: about 1.0 μm, Si doping amount: about $5\times10^{17}$ cm$^{-3}$), an undoped $(Al_{0.3}Ga_{0.7})_{0.5}In_{0.5}P$ active layer 3 (thickness: about 0.6 μm), a p-type $(Al_{0.7}Ga_{0.3})_{0.5}In_{0.5}P$ cladding layer 4 (thickness: about 1.0 μm, Zn doping amount: about $1\times10^{18}$ cm$^{-3}$), a p-type $Al_{0.7}Ga_{0.3}As$ current diffusing layer 15 (thickness: about 6 μm), and a p-type GaAs cap layer 6 (thickness: about 1 μm, Zn doping amount: about $3\times10^{18}$ cm$^{-3}$). In addition, on the underside of the n-type GaAs substrate 1, that is, on the surface opposite to the multilayered structure, an electrode 11 is formed. On the surface of the p-type GaAs cap layer 6, an electrode 12 is formed.

Furthermore, in the LED 200, an undoped $(Al_{0.7}Ga_{0.3})_{0.5}In_{0.5}P$ spacer layer 21 having a thickness of about 500 Å is formed between the active layer 3 and the p-cladding layer 4 formed thereon. The undoped spacer layer 21 is formed by not supplying a dopant source such as $SiH_4$, DEZn, and the like during the growth.

Furthermore, in the LED 200, the current diffusing layer 15 is formed in a three-layered structure including a first current diffusing layer 5, a second current diffusing layer 7, and a third current diffusing layer 8. The carrier concentrations of the respective layers 5, 7 and 8 included in the current diffusing layer 15 are set at different values from each other as shown in the portion (b) in FIG. 4. That is, the carrier concentration of the first current diffusing layer 5 most closely positioned to the p-cladding layer 4 is set to about $5\times10^{17}$ cm$^{-3}$. The carrier concentration of the second current diffusing layer 7 positioned between the first current diffusing layer 5 and the third current diffusing layer 8 is set to about $1\times10^{18}$ cm$^{3}$. And the carrier concentration of the third current diffusing layer 8 most closely positioned to the cap layer 6 is set to about $3\times10^{18}$ cm$^{-3}$. The first to third current diffusing layers 5, 7, and 8 are formed by sequentially increasing the amount of DEZn, which is the p-type dopant source used, during the growth of the respective layers. The thicknesses of the first to third current diffusing layers 5, 7, and 8 are set, for example, to about 1 μm, about 2.5 μm, and about 2.5 μm, respectively.

In the LED 200 with the aforementioned structure according to the present example, as seen in the carrier concentration profile shown in the portion (b) of FIG. 4, the p-type dopant Zn contained in the p-cladding layer 4 diffuses into a part of the undoped spacer layer 21 until about 100 Å of the spacer layer 21 remains without containing the diffused Zn. Thus, Zn does not diffuse through the entire undoped spacer layer 21. In the structure of above-mentioned LED 200, the remaining thickness of the undoped spacer layer 21 after the diffusion of Zn is well controlled in an improved manner, thereby realizing the optimized remaining thickness of about 100 Å shown in FIG. 2 with excellent reproducibility.

When the LED 200 is processed into a partial sample described referring to FIG. 11, the PL intensity is typically 88 at a relative value. This value is substantially the same as the measurement value obtained by using the undoped sample in the previously-mentioned first experiment.

Moreover, when the LED 200 is molded in a package having a diameter of about 5 mm and the intensity of emitted light is measured, about 6.5 candelas of light intensity is exhibited when the operation currency of about 20 mA is applied.

FIG. 5 is a diagram illustrating the relationship between the carrier concentration of the first current diffusing layer 5 most closely positioned to the p-cladding layer 4, and the design value of the thickness (designed thickness) of the undoped spacer layer 21 required to obtain the remaining thickness thereof of about 100 Å after the diffusion of Zn, in the LED 200 shown in FIG. 4.

As shown in FIG. 5, the smaller the carrier concentration of the first current diffusing layer 5 is, the smaller the designed thickness becomes. From the viewpoint of the efficiency of the production process, the smaller designed thickness of the undoped spacer layer 21 has advantages of reducing production cost and the time required for the processes. Moreover, when the first current diffusing layer 5 has a carrier concentration of about $1.5 \times 10^{18}$ cm$^{-3}$ or less, change in the designed thickness accompanied by the variation of the carrier concentration becomes small, whereby the remaining thickness is well controlled in an improved manner. Accordingly, it is desirable that the carrier concentration of the first current diffusing layer 5 is set to about $1.5 \times 10^{18}$ cm$^{-3}$ or less.

On the other hand, when the carrier concentration of the first current diffusing layer 5 is set to about $5 \times 10^{17}$ cm$^{-3}$ or less, for example, about $3 \times 10^{17}$ cm$^{-3}$, problems arise that the amount of carriers becomes too small, resulting in increase in the device resistance. Accordingly, it is desirable that the carrier concentration of the first current diffusing layer 5 is set to about $5 \times 10^{17}$ cm$^{-3}$ or more.

As a result, it is appropriate that the carrier concentration of the first current diffusing layer 5 is set in a range between about $5 \times 10^{17}$ cm$^3$ and about $1.5 \times 10^{18}$ cm$^{-3}$.

EXAMPLE 3

A portion (a) of FIG. 6 is a cross-sectional view showing a device structure of an AlGaInP type LED 300 according to a third example of the present invention. A portion (b) of FIG. 6 is a diagram showing a carrier concentration profile of each layer included in the LED 300. The carrier concentration profile is data obtained from the measurement conducted by using a SIMS, and an absolute value thereof is calibrated by the measurement data for the standard sample.

The LED 300 shown in the portion (a) of FIG. 6 has a multilayered structure obtained by sequentially forming, on an n-type GaAs substrate 1 by an MOCVD method, an n-type GaAs buffer layer 10 (thickness: about 0.1 $\mu$m, Si doping amount: about $5 \times 10^{17}$ cm$^{-3}$), an n-type $(Al_{0.7}Ga_{0.3})_{0.5}In_{0.5}P$ cladding layer 2 (thickness: about 1.0 $\mu$m, Si doping amount: about $5 \times 10^{17}$ cm$^{-3}$), an undoped $(Al_{0.3}Ga_{0.7})_{0.5}In_{0.5}P$ active layer 3 (thickness: about 0.6 $\mu$m), a p-type $(Al_{0.7}Ga_{0.3})_{0.5}In_{0.5}P$ cladding layer 4 (thickness: about 1.0 $\mu$m, Mg doping amount: about $1 \times 10^{18}$ cm$^{-3}$), a p-type $Al_{0.7}Ga_{0.3}As$ current diffusing layer 15 (thickness: about 6 $\mu$m), and a p-type GaAs cap layer 6 (thickness: about 1 $\mu$m, Mg doping amount: about $3 \times 10^{18}$ cm$^{-3}$). In addition, on the underside of the n-type GaAs substrate 1, that is, on the surface opposite to the multilayered structure, an electrode 11 is formed. On the surface of the p-type GaAs cap layer 6, an electrode 12 is formed.

Furthermore, In the LED 300, an undoped $(Al_{0.7}Ga_{0.3})_{0.5}In_{0.5}P$ spacer layer 21 having a thickness of about 500 Å is formed between the active layer 3 and the p-cladding layer 4 formed thereon. The undoped spacer layer 21 is formed by not supplying a dopant source such as SiH$_4$, CP$_2$Mg (cyclopentadienyl magnesium), and the like during the growth.

Furthermore, in the LED 300, a current diffusing layer 15 is formed in a three-layered structure including a first current diffusing layer 5, a second current diffusing layer 7, and a third current diffusing layer 8. The carrier concentration of the respective layers included in the current diffusing layer 15 is set in such a manner that the carrier concentration of the first current diffusing layer 5 most closely positioned to the p-cladding layer 4 is about $5 \times 10^{17}$ cm$^{-3}$ and the carrier concentration of the third current diffusing layer 8 most closely positioned to the cap layer 6 is about $3 \times 10^{18}$ cm$^{-3}$, as shown in the portion (b) in FIG. 6. Furthermore, the carrier concentration of the second current diffusing layer 7 positioned therebetween is continuously changed as shown in the portion (b) in FIG. 6. The first to third current diffusing layers 5, 7, and 8 are formed by sequentially increasing the amount of CP$_2$Mg, which is the p-type dopant source used, during the growth of the respective layers. Particularly, when the second current diffusing layer 7 is formed, the amount of supply of CP$_2$Mg is gradually increased from the amount used for the growth of the first current diffusing layer 5 to that for the growth of the third current diffusing layer 8 during the growth of the second current diffusing layer 7. The thicknesses of the first to third current diffusing layers 5, 7, and 8 are set, for example, to about 1 $\mu$m, about 2.5 $\mu$m, and about 2.5 $\mu$m, respectively.

In the LED 300 with the aforementioned structure according to the present example, as seen in the carrier concentration profile shown in the portion (b) of FIG. 6, the p-type dopant Mg contained in the p-cladding layer 4 diffuses into a part of the undoped spacer layer 21 until about 100 Å of the spacer layer 21 remains without containing the diffused Mg. Thus, Mg does not diffuse through the entire undoped spacer layer 21.

In the structure of above-mentioned LED 300, the current diffuses in the current diffusing layer 15 even better than in the case of the structure of the LED 200 in the second example.

When the LED 300 is processed into a partial sample described referring to FIG. 11, the PL intensity is typically 88 at a relative value. This value is substantially the same as the measurement value obtained by using the undoped sample in the previously-described first experiment.

Moreover, when the LED 300 is molded in a package having a diameter of about 5 mm and the intensity of emitted light is measured, about 6.7 candelas of light intensity is exhibited when the operation currency of about 20 mA is applied.

FIG. 7 is a diagram illustrating the relationship, with respect to the LED 300 shown in FIG. 6, between the carrier concentration of the third current diffusing layer 8 most remotely positioned from the p-cladding layer 4, and the intensity of emitted light when the carrier concentration of the first current diffusing layer 5 most closely positioned to the p-cladding layer 4 is changed in a range between about $5 \times 10^{17}$ cm$^{-3}$ and about $1.5 \times 10^{18}$ cm$^{-3}$ as a parameter. As shown in FIG. 7, in order to obtain the stable intensity of emitted light, it is appropriate that the carrier concentration of the third current diffusing layer 8 is set to about $2 \times 10^{18}$ cm$^{-3}$ or more.

EXAMPLE 4

A portion (a) of FIG. 8 is a cross-sectional view showing a device structure of an AlGaInP type LED 400 according to a fourth example of the present invention. A portion (b) of FIG. 8 is a diagram showing a carrier concentration profile of each layer included in the LED 400. The carrier concentration profile is data obtained from the measurement conducted by using a SIMS, and an absolute value thereof is calibrated by the measurement data for the standard sample.

The LED 400 shown in the portion (a) of FIG. 8 has a multilayered structure obtained by sequentially forming, on an n-type GaAs substrate 1 by an MOCVD method, an n-type GaAs buffer layer 10 (thickness: about 0.1 μm, Si doping amount: about $5 \times 10^{17}$ cm$^{-3}$), an n-type $(Al_{0.7}Ga_{0.3})_{0.5}In_{0.5}P$ cladding layer 2 (thickness: about 1.0 μm, Si doping amount: about $5 \times 10^{17}$ cm$^{-3}$), an undoped $(Al_{0.3}Ga_{0.7})_{0.5}In_{0.5}P$ active layer 3 (thickness: about 0.6 μm), a p-type $(Al_{0.7}Ga_{0.3})_{0.5}In_{0.5}P$ cladding layer 4 (thickness: about 1.0 μm, Mg doping amount: about $1 \times 10^{18}$ cm$^{-3}$), a p-type GaP current diffusing layer 25 (thickness: about 6 μm), and a p-type GaAs cap layer 6 (thickness: about 1 μm, Mg doping amount: about $3 \times 10^{18}$ cm$^{-3}$). In addition, on the underside of the n-type GaAs substrate 1, that is, on the surface opposite to the multilayered structure, an electrode 11 is formed. On the surface of the p-type GaAs cap layer 6, an electrode 12 is formed.

Furthermore, In the LED 400, an undoped $(Al_{0.7}Ga_{0.3})_{0.5}In_{0.5}P$ spacer layer 21 having a thickness of about 500 Å is formed between the active layer 3 and the p-cladding layer 4 formed thereon. The undoped spacer layer 21 is formed by not supplying a dopant source such as $SiH_4$, $CP_2Mg$, and the like during the growth.

Furthermore, in the LED 400, a current diffusing layer 25 is formed to include a first current diffusing layer 35, a second current diffusing layer 37, and a third current diffusing layer 38. The carrier concentration of the respective layers included in the current diffusing layer 25 is set in such a manner that the carrier concentration of the first current diffusing layer 35 most closely positioned to the p-cladding layer 4 is about $5 \times 10^{17}$ cm$^{-3}$ and the carrier concentration of the third current diffusing layer 38 most closely positioned to the cap layer 6 is set to about $3 \times 10^{18}$ cm$^{-3}$, as shown in the portion (b) in FIG. 8. Moreover, the carrier concentration of the second current diffusing layer 37 positioned therebetween is continuously changed as shown in the portion (b) in FIG. 8.

Furthermore, in the third current diffusing layer 38 made of p-type GaP, an undoped GaP layer 32 having a thickness of about 1000 Å is formed.

The first to third current diffusing layers 35, 37, and 38 are formed by sequentially increasing the amount of supply of $CP_2Mg$, which is a p-type dopant source used, during the growth of the respective layers. Particularly, when the second current diffusing layer 37 is formed, the amount of supply of $CP_2Mg$ is gradually increased from the amount used for the growth of the first current diffusing layer 35 to that for the growth of the third current diffusing layer 38 during the growth of the second current diffusing layer 37. The thicknesses of the first to third current diffusing layers 35, 37, and 38 are set, for example, to about 1 μm, about 2.5 μm, and about 2.5 μm, respectively.

In the LED 400 with the aforementioned structure according to the present example, as seen in the carrier concentration profile shown in the portion (b) of FIG. 8, the p-type dopant Mg contained in the p-cladding layer 4 diffuses into a part of the undoped spacer layer 21 until about 100 Å of the spacer layer 21 remains without containing the diffused Mg. Thus, Mg does not diffuse through the entire undoped spacer layer 21. And the p-type dopant Mg contained in the third p-type GaP current diffusing layer 38 diffuses into the entire undoped GaP layer 32, so that the GaP layer 32 has a carrier concentration of about $2 \times 10^{18}$ cm$^{-3}$.

Moreover, by providing the undoped GaP layer 32 in the third p-type GaP current diffusing layer 38, the top surface of the growing layer has an excellent morphology. In this manner, the electrode 12 can be easily formed on the surface of the cap layer 6 after the growth thereof.

When the LED 400 is processed into a partial sample described referring to FIG. 11, the PL intensity is typically 88 at a relative value. This value is substantially the same as the measurement value obtained by using the undoped sample in the previously-described first experiment.

Moreover, when the LED 400 is molded in a package having a diameter of about 5 mm and the light intensity of emitted light is measured, about 7 candelas of light intensity is exhibited when the operation currency of about 20 mA is applied.

When the undoped layer 32 formed in the third current diffusing layer 38 is formed in the structure of the LED 200 described in the second example or the LED 300 described in the third example, the same advantages can be obtained as those described above.

EXAMPLE 5

A portion (a) of FIG. 9 is a cross-sectional view showing a device structure of an AlGaInP type LED 500 according to the fifth example of the present invention. A portion (b) of FIG. 9 is a diagram showing a carrier concentration profile of each layer included in the LED 500. The carrier concentration profile is data obtained from the measurement conducted by using a SIMS, and an absolute value thereof is calibrated by the measurement data for the standard sample.

The LED 500 shown in the portion (a) of FIG. 9 has a multilayered structure obtained by sequentially forming, on an n-type GaAs substrate 1 by an MOCVD method, an n-type GaAs buffer layer 10 (thickness: about 0.1 μm, Si doping amount: about $5 \times 10^{17}$ cm$^{-3}$), an n-type $(Al_{0.7}Ga_{0.3})_{0.5}In_{0.5}P$ cladding layer 2 (thickness: about 1.0 μm, Si doping amount: about $5 \times 10^{17}$ cm$^{-3}$), an undoped $(Al_{0.3}Ga_{0.7})_{0.5}In_{0.5}P$ active layer 3 (thickness: about 0.6 μm), a p-type $(Al_{0.7}Ga_{0.3})_{0.5}In_{0.5}P$ cladding layer 4 (thickness: about 1.0 μm, Mg doping amount: about $1 \times 10^{18}$ cm$^{-3}$), a p-type $Al_{0.7}Ga_{0.3}As$ current diffusing layer 15 (thickness: about 6 μm), and a p-type GaAs cap layer 6 (thickness: about 1 μm, Mg doping amount: about $3 \times 10^{13}$ cm$^{-3}$). In addition, on the underside of the n-type GaAs substrate 1, that is, on the surface opposite to the multilayered structure, an electrode 11 is formed. On the surface of the p-type GaAs cap layer 6, an electrode 12 is formed.

Furthermore, In the LED 500, an undoped $(Al_{0.7}Ga_{0.3})_{0.5}In_{0.5}P$ spacer layer 21 having a thickness of about 500 Å is formed between the active layer 3 and the p-cladding layer 4 formed thereon. The undoped spacer layer 21 is formed by not supplying a dopant source such as $SiH_4$, $CP_2Mg$, and the like during the growth.

Furthermore, in the LED 500, the current diffusing layer 15 is formed in a three-layered structure including a first current diffusing layer 5, a second current diffusing layer 7, and a third current diffusing layer 8. The carrier concentration of the respective layers included in the current diffusing layer 15 is set in such a manner that the carrier concentration of the first carrier diffusing layer 5 most closely positioned to the p-cladding layer 4 is about $5 \times 10^{17}$ cm$^{-3}$ and the carrier concentration of the third current diffusing layer 8 most closely positioned to the cap layer 6 is about $3 \times 10^{18}$ cm$^{-3}$ as shown in the portion (b) in FIG. 9. Moreover, the carrier concentration of the second current diffusing layer 7 positioned therebetween is continuously changed as shown in the portion (b) in FIG. 9. The first to third current diffusing layers 5, 7, and 8 are formed by sequentially increasing the amount of supply of $CP_2Mg$, which is the p-type dopant source, during the growth of the respective layers. Particularly, when the second current diffusing layer 7 is formed, the amount of CP$_2$Mg is gradually increased from the amount used for the growth of the first current diffusing layer 5 to that for the growth of the third current diffusing layer 8 during the growth of the second current diffusing layer 7. The thicknesses of the first to third current diffusing layers 5, 7, and 8 are set, for example, to about 1 μm, about 2.5 μm, and about 2.5 μm, respectively.

Moreover in the LED 500 of the present example, an undoped (Al$_{0.7}$Ga$_{0.3}$)$_{0.5}$In$_{0.5}$P spacer layer 23 having a thickness of about 1000 Å is formed between the active layer 3 and the n-cladding layer 2 formed beneath the active layer 3. The undoped spacer layer 23 serves to prevent Si doped into the n-cladding layer 2 from diffusing in the active layer 3. The undoped spacer layer 23 is formed by not supplying a dopant source such as SiH$_4$, CP$_2$Mg, and the like during the growth.

When the LED 500 is processed into a partial sample described referring to FIG. 11, the PL intensity is typically 90 at a relative value. This value is substantially the same as the measurement value obtained by using the undoped sample in the previously-described first experiment.

Moreover, when the LED 500 is molded in a package having a diameter of about 5 mm and the light intensity of emitted light is measured, about 6.7 candelas of light intensity is exhibited when the operation currency of about 20 mA is applied.

When the undoped spacer layer 23 between the n-cladding layer 2 and the active layer 3 is formed in the structure of the LEDs 100 to 400 described in the first to fourth examples, the same advantages can be obtained as those described above.

The current diffusing layer in the LEDs used as light-emitting devices of the present invention is not limited to an AlGaAs layer or a GaP layer. Alternatively, the current diffusing layer can be an AlGaInP layer or an AlGaP layer. Moreover, in the present invention, the remarkable advantages can be obtained when using AlGaInP type material. However, the application of the present invention is not limited to this particular type of the material, but the same advantages as those described above can be obtained from the light-emitting devices mainly constituted by other types of the material such as the AlGaAs type, GaInPAs type, or AlGaInN type material. Moreover, although Zn or Mg is used as the p-type dopant in the aforementioned examples, the present invention is also effective when Be is used as the p-type dopant.

A method for forming the respective layers included in the multilayered structure is not limited to the MOCVD method mentioned above. Alternatively, other film formation methods generally used in a semiconductor technology, such as an MBE method, a gas source MBE method, a CBE method, and the like can be employed.

Furthermore, according to the present invention, when the relationship of conductive types (i.e., p-type and n-type) of the respective layers in the multilayered structure as well as of the dopants is reversed, the n-type dopant contained in the n-type cladding layer formed on the active layer is prevented from diffusing into the active layer. As a result, the same effect as those described in the examples can be obtained.

As described above, according to the present invention, a semiconductor light-emitting device has a multilayered structure including at least a first cladding layer of a first conductive type (for example, n-type), an undoped active layer, a second cladding layer of a second conductive type (for example, p-type), and a current diffusing layer of the second conductive type, formed on a semiconductor substrate of the first conductive type. In this structure, an undoped spacer layer is provided at least between the undoped active layer and the second cladding layer of the second conductive type. In this manner, the diffusion of dopant of the second conductive type contained in the second cladding layer of the second conductive type, which is induced by the current diffusing layer, is blocked at the undoped spacer layer. As a result, the degradation of crystallinity of the active layer caused by the diffusion of dopant and the resultant formation of non-radiative centers is suppressed. Consequently, a semiconductor light-emitting device such as an LED having an excellent light emitting efficiency can be obtained.

It is desirable that the thickness of the undoped spacer layer is set so that a portion thereof with a predetermined thickness remains undoped with dopant even if the dopant diffuses from the second cladding layer of the second conductive type into the undoped spacer layer. Specifically, the thickness of the undoped spacer layer is preferably set in a range between about 50 Å and about 2000 Å.

Moreover, another undoped spacer layer can be further provided between the undoped active layer and the first cladding layer of the first conductive type provided beneath the active layer. In this manner, the diffusion of dopant of the first conductive type from the first cladding layer into the active layer can be suppressed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light-emitting device, comprising:
   a semiconductor substrate of a first conductive type; and
   a multilayered structure formed on the semiconductor substrate, the multilayered structure including at least a first cladding layer of the first conductive type, an undoped active layer, a second cladding layer of a second conductive type, and a current diffusing layer of the second conductive type, which are subsequently deposited,
   wherein an undoped spacer layer is further provided between the undoped active layer and the second cladding layer, the undoped spacer layer having a composition ratio different from a composition ratio of the undoped active layer; and
   wherein the second cladding layer and the undoped spacer layer are made of a material having the same composition.

2. A semiconductor light-emitting device according to claim 1, wherein carrier concentration of a second portion of the current diffusing layer positioned remotely from the second cladding layer is higher than the carrier concentration of a first portion of the current diffusing layer positioned closely to the second cladding layer.

3. A semiconductor light-emitting device according to claim 2, wherein the carrier concentration continuously changes in a portion positioned between the first portion and the second portion of the current diffusing layer.

4. A semiconductor light-emitting device according to claim 3, wherein the carrier concentration of the first portion of the current diffusing layer is in a range between about 0.5×10$^{18}$ cm$^{-3}$ and about 1.5×10$^{18}$ cm$^{-3}$.

5. A semiconductor light-emitting device according to claim 4, wherein the carrier concentration of the second portion of the current diffusing layer is about $2 \times 10^{18}$ cm$^{-3}$ or more.

6. A semiconductor light-emitting device according to claim 2, wherein the carrier concentration of the first portion of the current diffusing layer is in a range between about $0.5 \times 10^{18}$ cm$^{-3}$ and about $1.5 \times 10^{18}$ cm$^{-3}$.

7. A semiconductor light-emitting device according to claim 6, wherein the carrier concentration of the second portion of the current diffusing layer is about $2 \times 10^{18}$ cm$^{-3}$ or more.

8. A semiconductor light-emitting device according to claim 1, wherein a thickness of the undoped spacer layer is in a range between about 50 Å and about 2000 Å.

9. A semiconductor light-emitting device according to claim 1, further comprising a second undoped spacer layer positioned between the first cladding layer and the undoped active layer.

10. A semiconductor light emitting device according to claim 9, wherein the first cladding layer and the second undoped spacer layer are made of a material having the same composition with each other.

11. A semiconductor light-emitting device according to claim 1, wherein the first cladding layer, the undoped active layer, and the second cladding layer are formed using AlGaInP or GaInP as main material; the current diffusing layer is formed using a material selected from a group consisting of AlGaAs, AlGaInP, GaP, and AlGaP as main material; and a dopant of the second cladding layer is Zn, Mg, or Be.

12. A semiconductor light-emitting device according to claim 1, wherein the second cladding layer and the undoped spacer layer have the same atomic percentage of each element in the composition.

13. A semiconductor light-emitting device according to claim 1, wherein a thickness of the undoped spacer layer is thinner than a thickness of the undoped active layer.

14. A semiconductor light-emitting device according to claim 1, wherein the undoped spacer layer and the undoped active layer are made of materials including the same constituent elements but in different atomic percentages.

15. A semiconductor light-emitting device, comprising:

a semiconductor substrate of a first conductive type;

a multilayered structure formed on the semiconductor substrate, including:

a first cladding layer of the first conductive type;

an undoped active layer formed over the first cladding layer made of a material having a first composition with a first composition ratio;

an undoped spacer layer made of a material having a second composition with a second composition ratio different from the first composition radio and with each constituent element in the first composition having a first atomic percentage;

a second cladding layer of a second conductive type formed on the undoped spacer layer and made of a material having the second composition with each element having the second atomic percentage; and a current diffusing layer of the second conductive type formed on the second cladding layer, wherein the diffusion of a dopant of the second conductive type contained in the second cladding layer induced by the current diffusing layer is blocked by the undoped spacer layer, thereby improving the efficiency of the semiconductor light-emitting device.

16. A semiconductor light-emitting device according to claim 15, wherein a thickness of the undoped spacer layer is thinner than a thickness of the undoped active layer.

17. A semiconductor light-emitting device according to claim 15, wherein the undoped active layer is made of a material including the same constituent elements as in the second composition of the undoped spacer layer but in a second atomic percentage different from the first atomic percentage.

* * * * *